(12) United States Patent
GanapathiSubramanian et al.

(10) Patent No.: US 8,913,230 B2
(45) Date of Patent: Dec. 16, 2014

(54) CHUCKING SYSTEM WITH RECESSED SUPPORT FEATURE

(75) Inventors: Mahadevan GanapathiSubramanian, Cedar Park, TX (US); Mario Johannes Meissl, Austin, TX (US); Avinash Panga, Austin, TX (US); Byung-Jin Choi, Austin, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 726 days.

(21) Appl. No.: 12/828,498

(22) Filed: Jul. 1, 2010

(65) Prior Publication Data
US 2011/0001954 A1 Jan. 6, 2011

Related U.S. Application Data

(60) Provisional application No. 61/222,794, filed on Jul. 2, 2009.

(51) Int. Cl.
| G03F 7/00 | (2006.01) |
| B82Y 10/00 | (2011.01) |
| B82Y 40/00 | (2011.01) |

(52) U.S. Cl.
CPC ............... *G03F 7/0002* (2013.01); *B82Y 10/00* (2013.01); *B82Y 40/00* (2013.01)
USPC .................... 355/76; 355/72; 355/73; 355/75; 355/91

(58) Field of Classification Search
USPC .............. 355/72–77, 78, 87, 91–94; 310/328, 310/323.17; 216/11, 52; 264/1.1, 1.21, 264/1.24, 1.25, 1.27, 1.36, 1.7, 1.31, 1.38, 264/264, 300, 296, 220–227, 496
See application file for complete search history.

(56) References Cited

U.S. PATENT DOCUMENTS

| 4,312,823 A * | 1/1982 | Kraakman et al. ............ 264/107 |
| 5,804,089 A * | 9/1998 | Suzuki et al. .................... 216/71 |
| 5,923,408 A * | 7/1999 | Takabayashi ................... 355/53 |
| 6,459,474 B1 * | 10/2002 | Okada ............................. 355/78 |
| 6,784,979 B2 * | 8/2004 | Tajima et al. ................... 355/78 |
| 6,873,087 B1 | 3/2005 | Choi et al. |
| 6,932,934 B2 | 8/2005 | Choi et al. |
| 6,936,194 B2 | 8/2005 | Watts |
| 7,157,036 B2 | 1/2007 | Choi et al. |
| 2004/0036850 A1 * | 2/2004 | Tsukamoto et al. ............ 355/72 |
| 2004/0065252 A1 | 4/2004 | Sreenivasan et al. |
| 2004/0065976 A1 | 4/2004 | Sreenivasan et al. |

(Continued)

FOREIGN PATENT DOCUMENTS

EP 1818721 A3 8/2007

OTHER PUBLICATIONS

Anonymous, Use of air pressure in an imprint method,Research Disclosure, Mason Publications, Hampshire, GB; vol. 493, No. 74; May 2, 2005, 1 page.

*Primary Examiner* — Toan Ton
*Assistant Examiner* — Christina Riddle
(74) *Attorney, Agent, or Firm* — Cameron A. King

(57) ABSTRACT

In an imprint lithography system, a recessed support on a template chuck may alter a shape of a template positioned thereon providing minimization and/or elimination of premature downward deflection of outer edges of the template in a nano imprint lithography process.

19 Claims, 7 Drawing Sheets

(56) References Cited

U.S. PATENT DOCUMENTS

| | | |
|---|---|---|
| 2004/0124566 A1 | 7/2004 | Sreenivasan et al. |
| 2004/0146792 A1* | 7/2004 | Nimmakayala et al. ........ 430/22 |
| 2004/0160582 A1* | 8/2004 | Lof et al. ........................ 355/30 |
| 2004/0188381 A1 | 9/2004 | Sreenivasan |
| 2004/0211754 A1 | 10/2004 | Sreenivasan |
| 2005/0006343 A1* | 1/2005 | Choi et al. ...................... 216/59 |
| 2005/0187339 A1 | 8/2005 | Xu et al. |
| 2006/0172031 A1* | 8/2006 | Babbs et al. .................. 425/385 |
| 2007/0114686 A1* | 5/2007 | Choi et al. ..................... 264/2.7 |
| 2008/0068580 A1* | 3/2008 | Mori et al. ...................... 355/72 |
| 2008/0079927 A1* | 4/2008 | Vernon ........................... 355/75 |
| 2008/0122144 A1 | 5/2008 | Zhang |

* cited by examiner

CHUCKING SYSTEM WITH RECESSED SUPPORT FEATURE

CROSS-REFERENCE TO RELATED APPLICATION

The present application claims priority to U.S. Provisional Application No. 61/222,794, filed on Jul. 2, 2009, which is hereby incorporated by reference in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
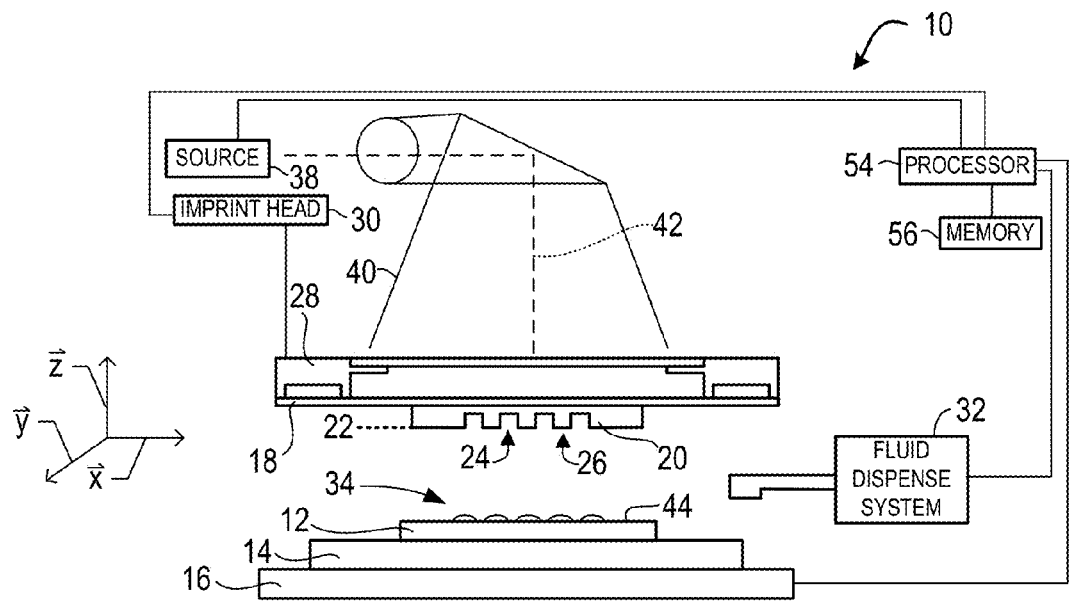
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z axes. Stage 16, substrate 12, and substrate chuck 14 may also be positioned on a base (not shown).

Spaced-apart from substrate 12 is template 18. Template 18 may include mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, both of which are hereby incorporated by reference herein.

Figure 2:
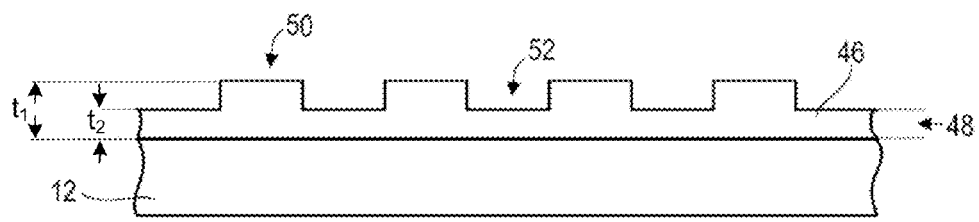
FIG. 2 illustrates a simplified side view of the substrate shown in FIG. 1 having a patterned layer positioned thereon.

Referring to FIGS. 1 and 2, system 10 may further comprise energy source 38 coupled to direct energy 40 along path 42. Imprint head 30 and stage may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or crosslink conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference herein.

Figure 3:
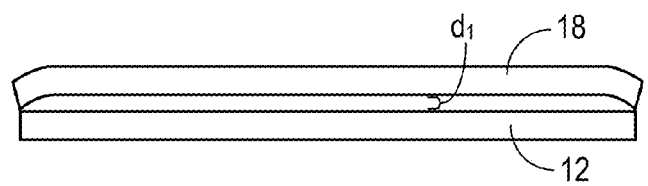
FIG. 3 illustrates a simplified side view of a template chuck wherein an outer region of the template contacts a substrate.

Referring to FIG. 3, generally, during imprinting, template 18 and 12 substrate are brought into close proximity at a distance $d_1$ to form patterned layer 46 as described and illustrated in relation to FIGS. 1 and 2. For example, template 18 and substrate 12 may be brought within $d_1<15$ µm. For template replication processes, the length of template 18 and the length of substrate 12 may be substantially the same. As such, downward deflection induced at the edge of template 18 may potentially cause outer edges of template 18 to contact substrate 12 when template 18 and substrate 12 are separated by distance $d_1$. This type of contact between template 18 and substrate 12 at outer edges of template 18 caused by downward deflection of template 18 may be a source of particulation and/or stress. Additionally, this contact may prevent template 18 from providing the contact needed between mold 20 and substrate 12 and/or polymerizable material 34 during imprinting as described in relation to FIGS. 1 and 2.

Figure 4:
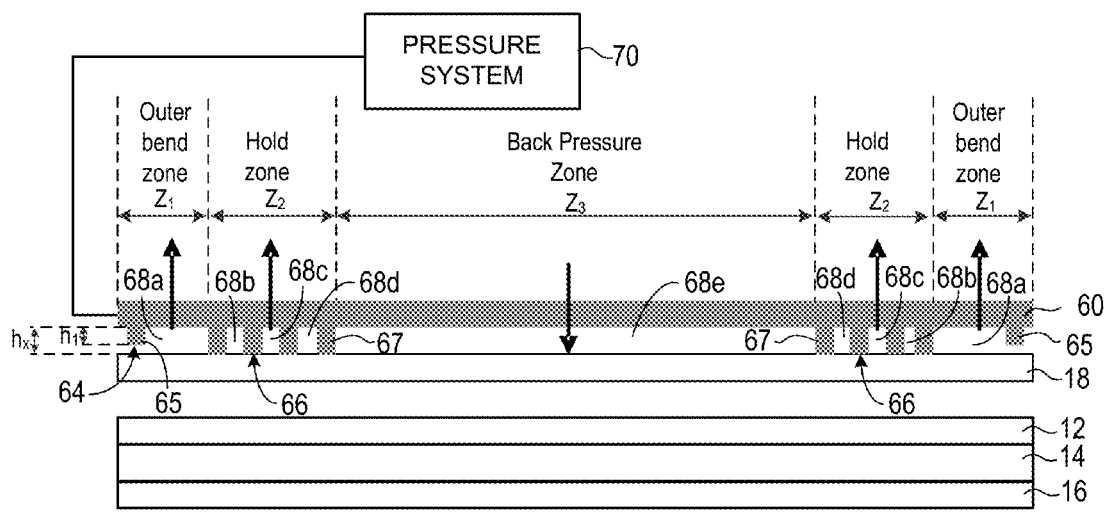
FIG. 4 illustrates a simplified side view of a template chuck having recessed supports and a substrate chuck having recessed supports.

To reduce downward deflection at outer edges of template 18 and/or substrate 12, chuck systems may include a recessed support feature supporting template 18 and/or substrate 12 at outer edges. Recessed support feature of template 18 may provide physical clearance of template 18 from substrate 12 at outer edges of template 18 during a nano imprint lithography process. FIG. 4 illustrates a template chuck 60 having a recessed support section 64 and a holding support section 66. Recessed support section 64 cinctures holding support section 66 such that recessed support section 64 is on the outer boundary of chuck 60.

Recessed support section 64 is positioned as the outer support section of chuck 60 and may comprise one or more recessed lands 65. For example, FIG. 4 illustrates recessed support section 64 having a single land 65 positioned at outer edge of chuck 60; however, one or more additional recessed lands 65 may be positioned at outer edge of chuck 60 providing recessed support section 64. Individual lands 65 of recessed support section 64 may be substantially similar in dimension or minimally altered to minimize and/or eliminate downward deflection of outer edges of template 18 during imprinting and/or separation in accordance with the present invention. Height $h_1$ of recessed land may be configured to provide template 18 in a deflected shape wherein outer edges of template 18 curve towards chuck 60 instead of towards substrate 12.

Recessed support section 64 may include one or more lands 65 having a length $h_1$ less than the length $h_x$ of lands 67 of holding support section 66. Lands 67 of holding support section 66 may be positioned in the mid section to inner section of chuck 60. For example, recessed support 64 may have land 65 with a length $h_1$ that is approximately 40 µm less than length $h_x$ of land 67 of holding support section 66 positioned in mid section to inner section of chuck 60. Holding support section 66 may include one or more lands 67. For example, FIG. 4 illustrates holding support section 66 having four lands 67, however, any number of lands may be used in accordance with the present invention.

Template chuck 60 may also include a plurality of chambers 68 formed with recessed support section 64, holding support section 66 and portions of template 18. As illustrated in FIG. 4, chamber 68a is formed between land 65 of recessed support 64 and an outer land 67 of holding support section 66 and includes a portion of template 18. Chambers 68b-68e are formed between lands 67 of holding support section 66 and portions of template 18.

Chambers 68a-68e may provide three distinct zones of template chuck 60: an outer bend zone $Z_1$, a hold zone $Z_2$, and a back pressure zone $Z_3$. A pressure system 70 may operate to control pressure within each zone $Z_1$-$Z_3$. Pressure system 70 may be in fluid communication with chambers 68a-68e. In one embodiment, a single pressure system 70 may operate to control pressure within each zone $Z_1$-$Z_3$. Alternatively, two or more pressure systems 70 may operate to control pressure within each zone $Z_1$-$Z_3$. Pressure may include application of pressure (i.e., pressure state) within zones $Z_1$-$Z_3$ and/or application of vacuum force (i.e., vacuum state) within zones $Z_1$-$Z_3$. Generally, pressure state may be between approximately 0 to 10 kPa and vacuum state may be between approximately 0 to –90 kPa.

Outer bend zone $Z_1$ includes recessed support section 64. Positioning of recessed support section 64 within outer bend zone $Z_1$ and/or at a distance from imprinting area may amplify a convex shape of template 18 provided during imprinting as is described in further detail below.

Reduced height of lands 65 in recessed support section 64 as compared to lands 67 (i.e., $h_x$–h1) may also reduce stress on template 18 for a given deflection. For example, by providing support closer to the location of maximum stress, the maximum stress of template 18 may be reduced.

Hold zone $Z_2$ includes lands 67 and chambers 68b-68d of holding support section 66. Lands 67 of holding support section 66 may aid in flattening template 18 during imprinting. Flattening of template 18 during imprinting may reduce variation in thickness $t_2$ of residual layer 48 (described and illustrated in FIG. 2). For example, in referring to FIGS. 1, 2 and 4, length of hold zone $Z_3$ may be configured to provide patterning surface 22 of mold 20 in a substantially planar state (i.e., not tilted), such that, during imprinting contact of patterning surface 22 of mold 20 with polymerizable material 34 may be substantially planar resulting in minimal variations in thickness of residual layer 48. Additionally, control of pressure within chambers 68b-68d of hold zone $Z_3$ during imprinting may aid in reducing variation in thickness $t_2$ of residual layer 48 as further described below. Flattening of template 18 may also aid in alignment of template 18 and substrate 12 during imprinting as alignment marks within template 18 may be optimally positioned with minimal variations.

Back pressure zone $Z_3$ includes area in superimposition with features to be imprinted on substrate 12. Pressure system 70 may provide back pressure zone $Z_3$ in a pressure state during imprinting such that surface of template 18 contacts material positioned on substrate 12. For example, such pressure may facilitate contact of template 18 to polymerizable material 34 as described and illustrated in relation to FIGS. 1 and 2.

Template chuck 60 may also alter shape of template 18 during imprinting and separation. For example, template chuck 60 may position template 18 in a first shape during filling of polymerizable material 34 (FIG. 1) between template 18 and substrate 12 providing curvature for faster filling during contact between template 18 and polymerizable material 34 (FIG. 1) and/or template chuck 60 may position template 18 in a second shape during separation to lower separation forces needed to separate template 18 and substrate 12.

Figure 5A:
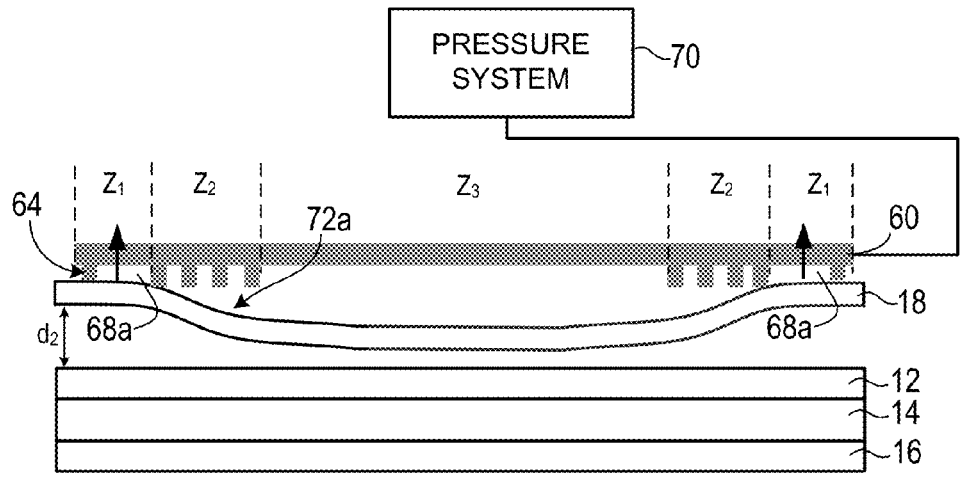
FIGS. 5A-5C illustrate a simplified side view of the template chuck and substrate chuck of FIG. 4 during an imprinting process.
Figure 5B:
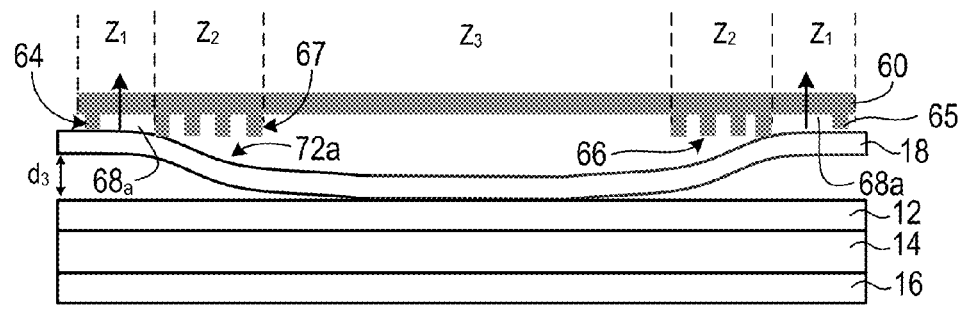
Figure 5C:
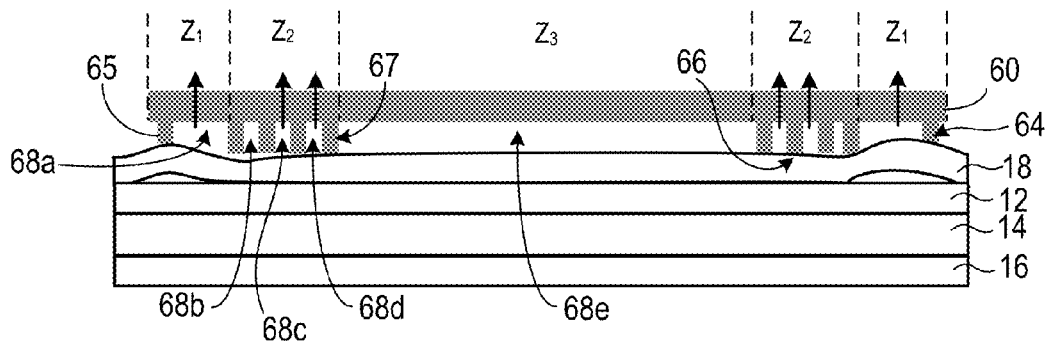

FIGS. 5A-5C illustrate template chuck 60 during an imprinting process. Referring to FIG. 5A, prior to imprinting, pressure system 70 may provide outer bend zones $Z_1$ of template chuck 60 in a vacuum state (e.g. −40 kPa to −80 kPa) such that template 18 assumes a first shape 72a (i.e., convex shape). Additionally, pressure system 70 may provide hold zone $Z_2$ and back pressure zone $Z_3$ in a pressure state. For example, hold zone may $Z_2$ may be in a low vacuum state (e.g., 0 to −40 kPa) or pressure state (e.g., 0 to 10 kPa) and back pressure zone $Z_3$ may be in a pressure state (0 to 10 kPa). Substrate chuck 14 may provide substrate 12 in a substantially flat position during the imprinting process. Template 18 and substrate 12 may be positioned in superimposition as described in relation to FIG. 1 and separated by a distance $d_2$.

Referring to FIG. 5B, distance $d_3$ between template 18 and substrate 12 may be reduced, positioning template 18 in contact with substrate 12 and/or polymerizable material 34 deposited on substrate 12. During contact of template 18 with substrate 12 and/or polymerizable material 34, template chuck 60 may provide at least a portion of template 18 in shape 72a or a position substantially similar to shape 72a. Recessed support section 64 may simultaneously prevent outer edges of template 18 from contacting substrate 12.

Referring to FIGS. 1, 2 and 5C, once template 18 transfers a pattern to polymerizable material 34, pressure system 70 may provide hold zone $Z_2$ in a vacuum state. Vacuum state may be between approximately −40 kPa to −80 kPa. By providing hold zone $Z_2$ in a vacuum state, variation of thickness $t_2$ may be minimized at least at the edge of patterned layer 46. Recessed support section 64 provides rigid support closer to the edge of mold 20. Such support reduces deflection at outer edges of template 18 resulting in minimization and/or elimination of variation in thickness $t_2$ of the resulting residual layer 48.

Figure 6:
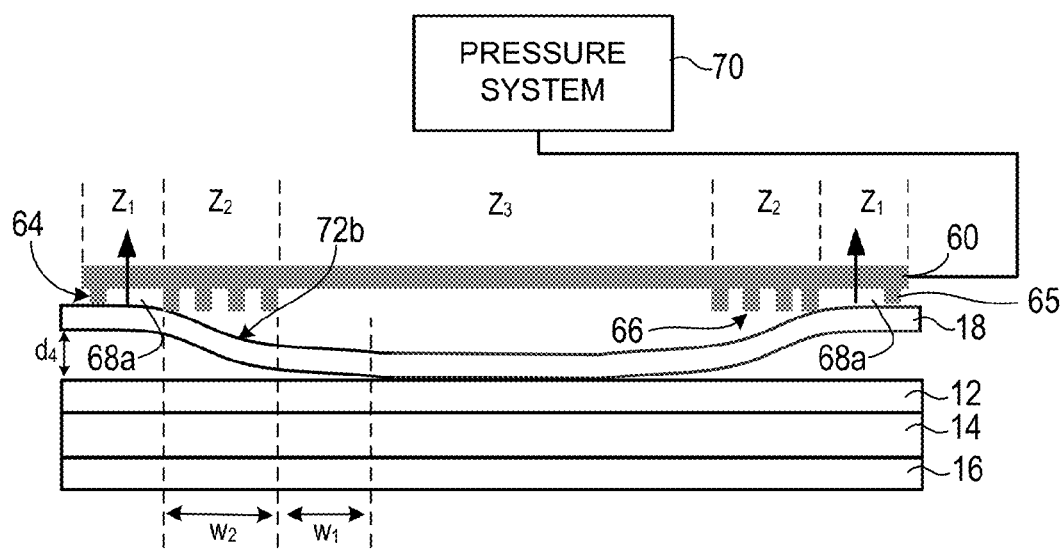
FIG. 6 illustrates a simplified side view of the template chuck and substrate chuck of FIG. 4 during a separation process.

FIG. 6 illustrates template chuck 60 during separation of template 18 from substrate 12. Generally, recessed support section 64 may aid in providing distance between outer edges of template 18 and substrate 12. For example, template chuck 60 may provide template 18 in a second shape 72b (e.g., convex shape). Shape 72b provides template 18 and substrate 12 at a distance $d_3$ (e.g., less than approximately 40 µm). Second shape 72b may be substantially similar or different than first shape 72a shown in FIG. 5A. Substrate 12 may be substantially flat during the separation process. For example, substrate chuck 14 may be a pin type chuck holding substrate 12 substantially flat during separation.

During separation, pressure system 70 may provide hold zone $Z_2$ in a hold or substantially neutral state (e.g., non-vacuum) and/or increase pressure in hold zone $Z_2$. This may increase the free span length $w_1$ of template 18 to $(w_1+w_2)$ with $w_2$ being the increase in free span length. Free span length $w_1$ may be defined as the length of template 18 that is unsupported by template chuck 60 (i.e., the distance between the last constraint of template 18 on chuck 60 and edge of patterned layer 46 on substrate). In one example, the diameter of back pressure zone $Z_3$ may be approximately 102 mm, the diameters of outer bend zone $Z_1$ may be approximately 115 mm such that the increase in free span length $w_2$ is approximately 6.5 mm.

The increase in free span length ($w_2$) may reduce the magnitude of separation force needed to separate template 18 and patterned layer 46. Additionally, positioning of template 18 in second shape 72b may increase the crack angle by providing a larger lever arm for the same applied force such that the angle is higher, further reducing the magnitude of separation force required to separate template 18 and patterned layer 46.

Figure 7:
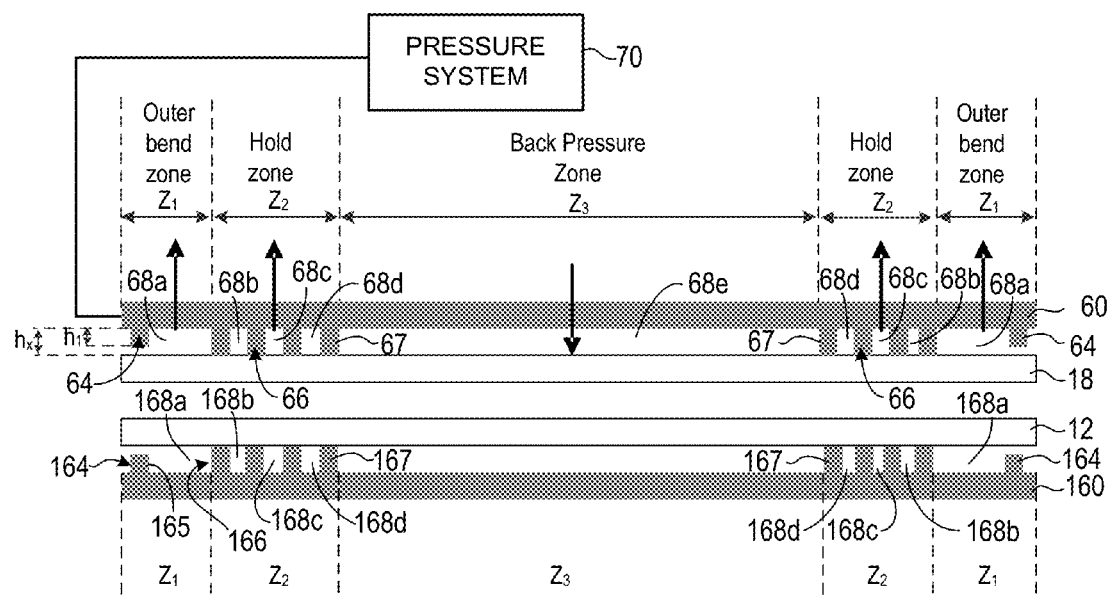
FIG. 7 illustrates a simplified side view of a template chuck having recessed supports and a substrate chuck having recessed supports.
Figure 8A:
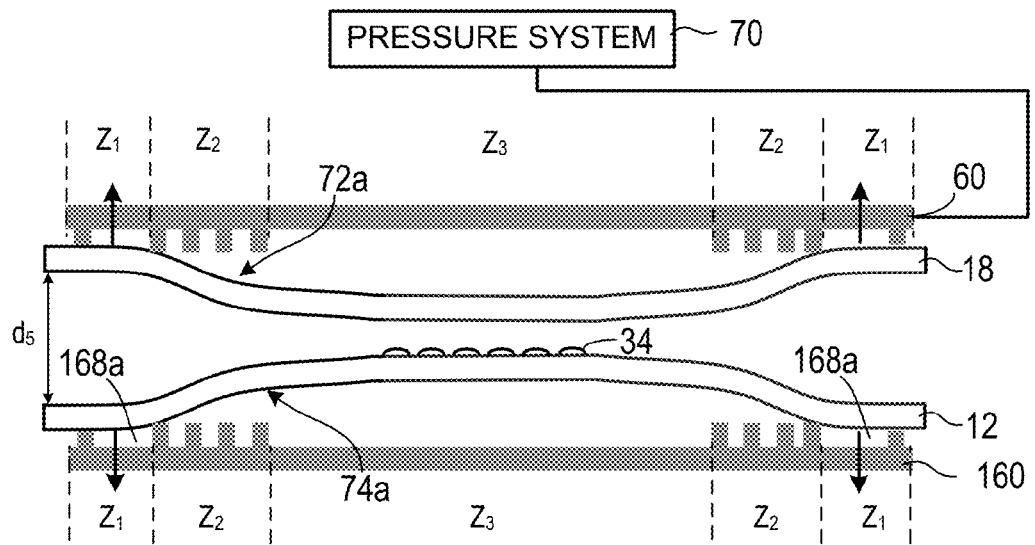
FIGS. 8A-8C illustrate a simplified side view of the template chuck and substrate chuck of FIG. 7 during an imprinting process.
Figure 8B:
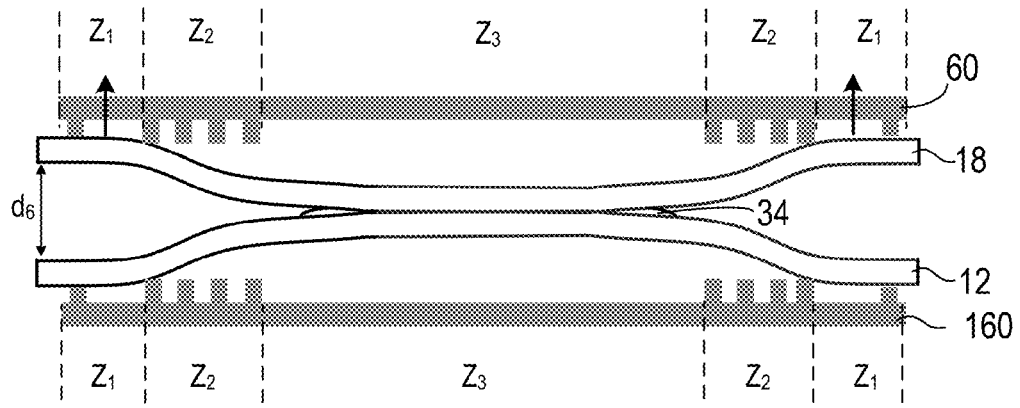
Figure 8C:
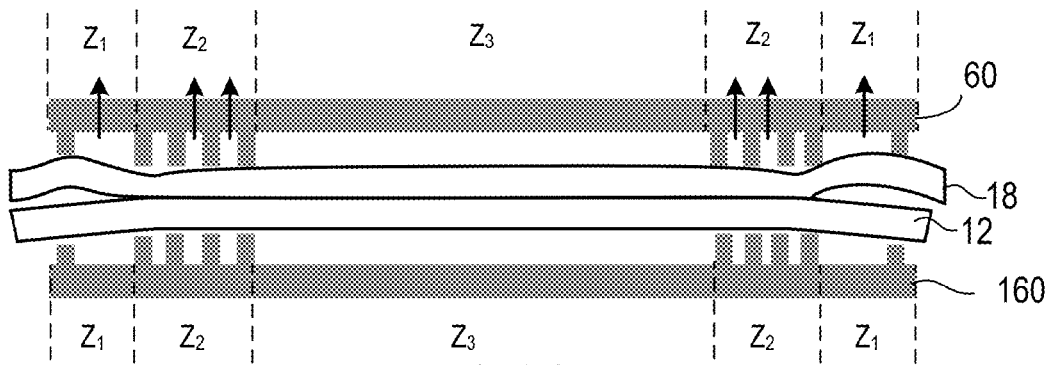
Figure 9:
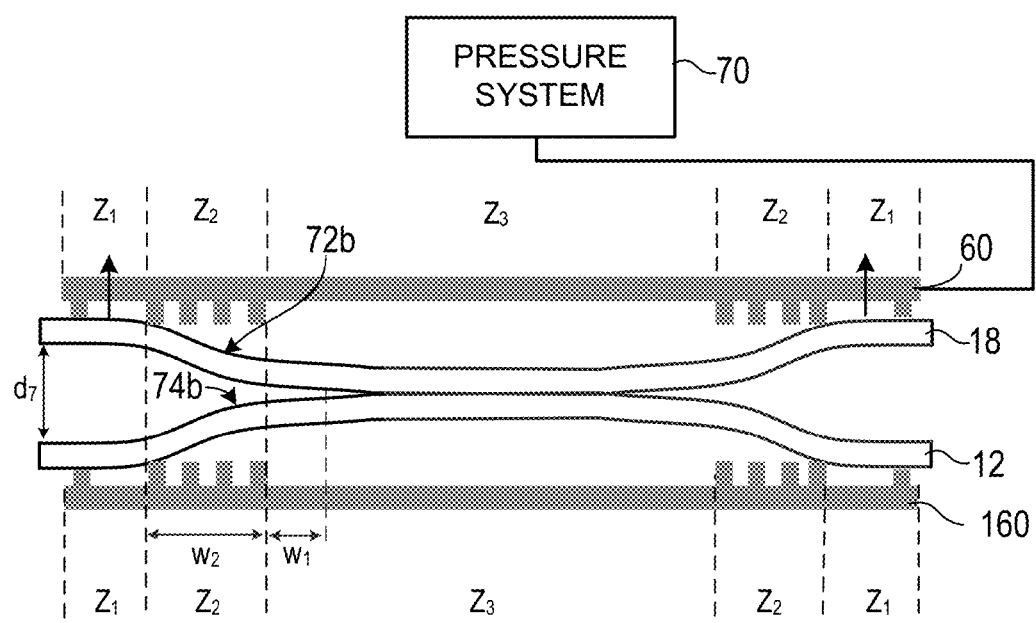
FIG. 9 illustrates a simplified side view of the template chuck and substrate chuck of FIG. 7 during a separation process.

FIGS. 7-9 illustrate another embodiment wherein substrate chuck 160 may include a recessed support section 164 similar to recessed support section 64 of template chuck 60. Recessed support section 164 may be positioned to support outer edge of substrate 12.

Recessed support section 164 may include one or more recessed lands 165 positioned at outer edge of chuck 160. For example, FIG. 7 illustrates recessed support section 164 having a single land 165 positioned at outer edge of chuck 160. Lands 165 may be substantially similar in dimension to lands 65 and configured to minimize and/or eliminate deflection of outer edges of template 18 during imprinting and/or separation in accordance with the present invention. Substrate chuck 160 may be used in lieu of, or in addition to, template chuck 60.

Substrate chuck 160 may also include a holding support section 166. Holding support section may have one or more lands 167 similar to lands 67. For example, holding support section 166 of substrate chuck 160 in FIG. 7 includes four lands 167.

Substrate chuck 160 may include a plurality of chambers 168 formed between recessed support section 164, holding support section 166 and portions of template 18. For example, chamber 168a is formed between land 165 of recessed support section 164 and an outer land 167 of holding support section 166 along with a portion of template 18. Chambers 168b-168e are formed between lands 167 of holding support section 166 and portions of template 18.

Similar to template chuck 60, chambers 168a-168e may provide three distinct zones: an outer bend zone $Z_1$, a hold zone $Z_2$ and a back pressure zone $Z_3$. Pressure system 70 may operate to control pressure within each zone $Z_1$-$Z_3$. Alternatively, a separate system from pressure system 70 may be used to control pressure within each zone $Z_1$-$Z_3$.

FIGS. 8A-8C illustrate substrate chuck 160 during an imprinting process. Referring to FIG. 8A, prior to imprinting, pressure system 70 may provide outer bend zones $Z_1$ of template chuck 60 and substrate chuck 160 in a vacuum state such that template 18 assumes first shape 72a (i.e., convex shape in relation to chuck 60) and substrate 12 assumes first shape 74a (e.g., convex shape in relation to chuck 160). For example, substrate chuck 60b may provide substrate 12 in shape 74a such that edges of template 18 and edges of substrate 12 are spaced apart a distance $d_5$. Distance $d_5$ may be between approximately 100 µm-750 µm.

Referring to FIG. 8B, distance $d_6$ between template 18 and substrate 12 may be reduced, positioning template 18 in contact with substrate 12 and/or polymerizable material 34 deposited on substrate 12 (e.g., distance $d_6$ may be between approximately 80 μm to 150 μm). During contact of template 18 with substrate 12 and/or polymerizable material 34, template chuck 60 may provide at least a portion of template 18 in shape 72a or a position substantially similar to shape 72a and substrate chuck 160 may provide at least a portion of substrate 12 in shape 74a or a position substantially similar to shape 74a. Recessed support sections 64 and 164 may simultaneously prevent outer edges of template 18 from contacting outer edges of substrate 12.

Referring to FIGS. 1, 2 and 9C, once template 18 transfers a pattern to polymerizable material 34, pressure system 70 may provide hold zones $Z_2$ of template chuck 60 and substrate chuck 160 in vacuum states. Recessed support sections 64 and 164 provides rigid support closer to the edge of mold 20. Such support reduces deflection at outer edges of template 18 and substrate 12 resulting in minimization and/or elimination of variation in thickness $t_2$ of the resulting residual layer 48.

FIG. 9 illustrates template chuck 60 and substrate chuck 160 during separation of template 18 from substrate 12. Generally, recessed support sections 64 and 164 may aid in providing distance between outer edges of template 18 and substrate 12. For example, template chuck 60 may provide template 18 in second shape 72b (i.e., convex shape) and substrate chuck 160 may provide substrate 12 in a second shape 74b (i.e., convex shape). Shapes 72b and 74b provide template 18 and substrate 12 at a distance $d_7$ (e.g., between approximately 80 μm-200 μm).

During separation, pressure system 70 may provide hold zones $Z_2$ of template chuck 60 and substrate chuck 160 in a hold or substantially neutral state (e.g., non-vacuum) and/or increase pressure in hold zone $Z_2$. This may increase the free span length $w_1$ of template 18 to $(w_1+w_2)$. Free span length $w_1$ may be defined as the length of template 18 that is unsupported by template chuck 60 (i.e., the distance between the last constraint of template 18 on chuck 60 and edge of patterned layer 46 on substrate). The increase in free span length may reduce the magnitude of separation force needed to separate template 18 and patterned layer 46. Additionally, positioning of template 18 in second shape 72b may increase the crack angle, further reducing the magnitude of separation force required to separate template 18 and patterned layer 46.

What is claimed is:

1. A chucking system, comprising:
a template chuck having a holding support section and a recessed support section, the recessed support section cincturing the holding support section, with
the holding support section having a plurality of lands for supporting a template, the lands extending a first height from the template chuck, and
the recessed support section having at least one recessed land for supporting a template, the recessed land extending a second height from the template chuck, wherein the second height is substantially less than the first height.

2. The chucking system of claim 1, wherein the recessed land of the recessed support section extends from an outer edge of the template chuck.

3. The chucking system of claim 1, further comprising a plurality of chambers formed between the recessed land of recessed support section, lands of holding support section, and portions of a template positioned on the template chuck.

4. The chucking system of claim 3, wherein the plurality of chambers are configured to provide three zones: an outer bend zone, a hold zone, and a back pressure zone.

5. The chucking system of claim 4, further comprising a pressure system in fluid communication with each chamber.

6. The chucking system of claim 1, wherein the height of the recessed land is configured to provide physical clearance of a template positioned thereon from a substrate positioned in superimposition with the template.

7. The chucking system of claim 1, wherein the height of recessed land as compared to the height of the lands of holding support section is configured to reduce stress of a template positioned thereon.

8. The chucking system of claim 1, wherein dimensions of lands of holding support section are configured to substantially flatten a template positioned thereon.

9. The chucking system of claim 1, wherein the height of the recessed land is configured to provide outer edges of a template positioned thereon to curve towards the template chuck.

10. The chucking system of claim 1, further comprising a template positioned on template chuck, wherein the recessed land of the recessed support section is configured to alter the shape of the template substantially preventing downward deflection of outer edges of the template.

11. The chucking system of claim 10, wherein the altered shape of the template deflects outer edges of the template upward.

12. The chucking system of claim 10, further comprising a substrate positioned in superimposition with the template, the substrate coupled to a substrate chuck, the substrate chuck comprising a plurality of lands with at least one land being a recessed land having a height less than all other lands.

13. The chucking system of claim 12, wherein the recessed land of the substrate chuck is positioned on an outer boundary of the substrate chuck.

14. The chucking system of claim 13, wherein the recessed land of the substrate chuck alters the shape of the substrate such that outer edges of the substrate curve towards the substrate chuck.

15. A chucking system, comprising:
a template chuck having a back pressure zone;
a hold zone cincturing the back pressure zone; and
an outer bend zone cincturing the hold zone,
the hold zone having a plurality of lands for supporting a template, each land extending a height from the template chuck, and the outer bend zone having a recessed land positioned on an outer boundary of the template chuck, the recessed land extending from the template chuck a height substantially less than the height of the lands in the hold zone.

16. The chucking system of claim 15, further comprising a template positioned on the template chuck wherein the height of the recessed land, as compared to the height of the lands of the hold zone, is configured to reduce stress of the template positioned thereon.

17. The chucking system of claim 15, wherein dimensions of the lands of the hold zone are configured to substantially flatten a template positioned thereon.

18. The chucking system of claim 15, wherein the back pressure zone, the hold zone, and the outer bend zone are in fluid communication with a pressure system.

19. The chucking system of claim 15, wherein a template is positioned on the template chuck, the template is in superimposition with a substrate coupled to a substrate chuck, the substrate chuck having at least one recessed land positioned on an outer edge of the substrate chuck.

* * * * *